United States Patent [19]

Mahler et al.

[11] Patent Number: 5,097,153
[45] Date of Patent: Mar. 17, 1992

[54] TTL COMPATIBLE BICMOS INPUT CIRCUIT

[75] Inventors: Theodor W. Mahler; Susan A. Curtis, both of Sherman, Tex.

[73] Assignee: Texas Instruments Incorporated, Dallas, Tex.

[21] Appl. No.: 610,728

[22] Filed: Nov. 9, 1990

Related U.S. Application Data

[63] Continuation of Ser. No. 350,655, May 11, 1989, abandoned.

[51] Int. Cl.⁵ .................. H03K 19/094; H03K 17/16
[52] U.S. Cl. .................................... 307/475; 307/446; 307/451; 307/542; 307/548; 307/570; 307/572
[58] Field of Search ............... 307/443, 446, 448, 451, 307/542, 547, 548, 570, 572, 475

[56] References Cited

U.S. PATENT DOCUMENTS 4,839,537  6/1989  Ueno ................... 307/451

Primary Examiner—Stanley D. Miller
Assistant Examiner—Margaret R. Wambach
Attorney, Agent, or Firm—James C. Kesterson; B. Peter Barndt; Richard L. Donaldson

[57] ABSTRACT

An input circuit is provided which receives TTL voltage signals as input and transmits CMOS voltage signal levels. A separation transistor connected to a voltage divider network is included within the circuit to separate the two gates of a CMOS inverter from the TTL input such that one gate of the inverter is fully off when the other gate is on and fully on when the other gate is off. Thus internal ground voltage fluctuations during operation of the circuit are avoided.

15 Claims, 4 Drawing Sheets

TTL COMPATIBLE BICMOS INPUT CIRCUIT

This application is a division of application Ser. No. 07/350,655 filed May 11, 1989, now abandoned.

BACKGROUND OF THE INVENTION

Field of Invention

This invention pertains to an input circuit for a BiCMOS device. More particularly, the invention pertains to a circuit which accepts as input signals having TTL levels and outputs signals having levels acceptable to a BiCMOS circuit. Such interface circuits are referred to as "T" input circuits.

SUMMARY OF THE INVENTION

The present invention is an input circuit which interfaces between TTL signal levels and CMOS signal levels.

The first object of invention is to provide a voltage level shifting circuit that will accept as input voltages at TTL levels and transmit as output voltages at CMOS levels.

Another object of invention is to provide a BiCMOS input circuit that will completely turn off the P-channel transistor of an input inverter constructed with CMOS devices operating under TTL input levels.

Yet another object of invention is to provide a BiCMOS input circuit that will completely turn off a P-channel transistor and thereby greatly reduce the adverse effects of internal ground voltage fluctuations during the operation of the input inverter.

DESCRIPTION OF THE PREFERRED EMBODIMENT

Figure 1:
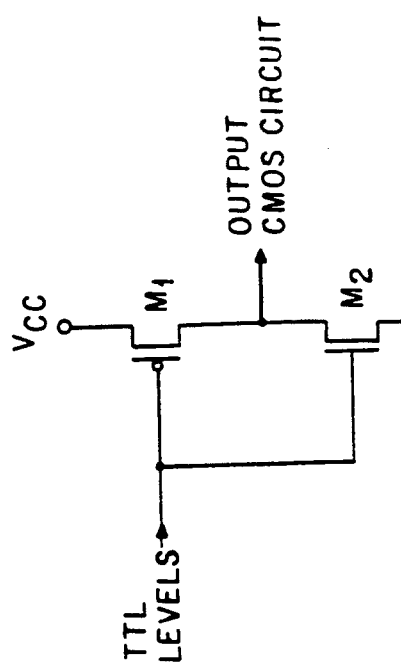
FIG. 1 shows a prior art circuit for interfacing between TTL circuits and BiCMOS circuits.

FIG. 1 shows a simple conventional "T" input circuit in which a P-channel transistor M1 is connected to an N-channel transistor M2 to form an input inverter circuit.

The ratio of the gate-width of M1 to the gate-width of M2 is skewed such that the resulting gate threshold voltage of the inverter is moved from 2.5 volts to approximately 1.5 volts. While this makes the gate threshold voltage compatible with TTL input signal levels, other problems arise with this method. One such problem is that while the inverter threshold is now 1.5 volts, the voltage at which the P-channel transistor completely turns off is still approximately 3.5 volts. A TTL input voltage level (low=0.8 v, high=2.0 v) never achieves a high enough voltage to completely turn the P-channel transistor off. Switching of the inverter is accomplished only because the N-channel transistor is turned on and can sink sufficient current from the still conducting P-channel transistor to cause the inverter output to drop to a low voltage level. Thus, when the input is high, the input inverter will have an undesirable through current that will be dependent on the input voltage level.

Another problem with this method of obtaining "T" inputs is sensitivity to internal ground voltage fluctuations or ground noise. If internal ground voltage shifts up with respect to the input voltage, the voltage differential of the N-channel transistor M2 gate to source will drop enough to turn the M2 transistor off. Since the output of the inverter is low due to the M2 transistor sinking the current from the still-conducting P-channel transistor M1, the output will rise in response to the loss of this current sink. Thus, a false voltage pulse will propagate through the circuit, producing unwanted logic transients.

Figure 2A:
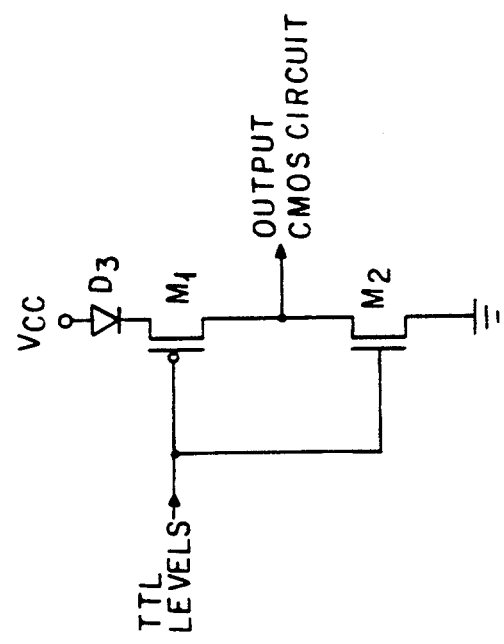
FIGS. 2a and 2b show additional prior art circuits for interfacing between TTL circuits and BiCMOS circuits.
Figure 2B:
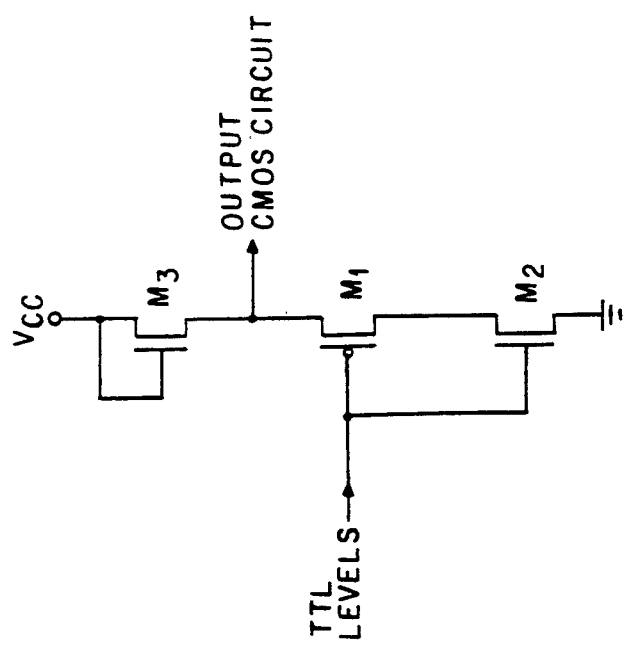

FIGS. 2a and 2b show another conventional method used to achieve "T" inputs with CMOS circuits. Here a device is placed between the source of the input inverter P-channel transistor M1 and VCC. This device can be either a bipolar diode D3 as shown in FIG. 2a or an N-channel transistor M3 connected in a diode configuration as shown in FIG. 2b. By using the voltage drop across M3 to lower the voltage at the source of M1, the threshold voltage of M1 will also be lowered. A feedback transistor is sometimes used to short out the diode D3 in FIG. 2a so that the output of the inverter will pull up completely to VCC once M1 is conducting. Although the diode D3 drops the threshold voltage of M1, a skewing of the P to N-channel ratio is still needed to completely achieve TTL input thresholds. This method still does not completely turn M1 off and the input remains sensitive to internal ground voltage fluctuations.

Figure 3:
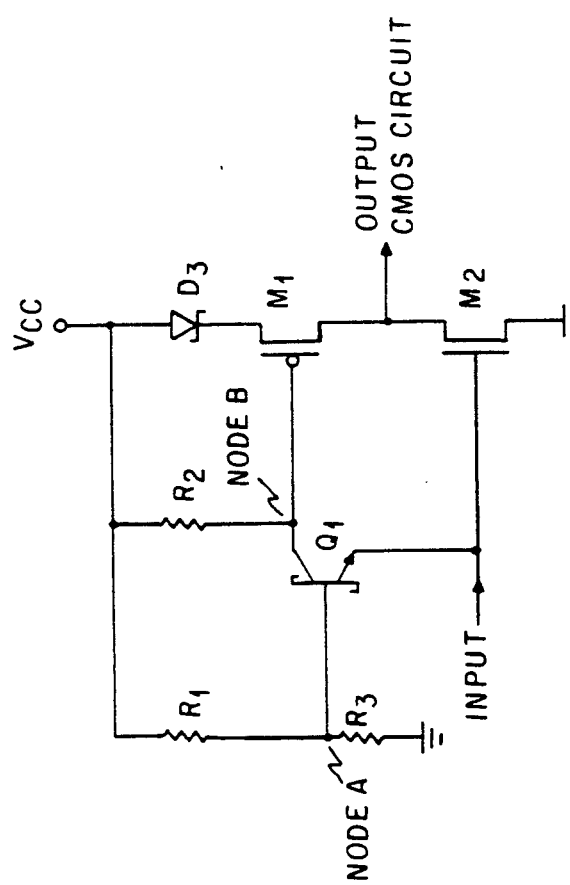
FIG. 3 illustrates a "T" input circuit made according to the teachings of the present invention.

Referring to FIG. 3, transistors M1 and M2 comprise a standard CMOS input inverter including a dropping diode D3. Components R1, R2, R3, and Q1 are the components added to the standard input inverter to form the "T" input circuit of the present invention. Q1 serves to separate the gate of P-channel transistor M1 from the TTL inputs, allowing the gate to pull up to VCC through R2. Resistors R1 and R3 form a voltage divider network to set the point at which transistor Q1 will turn on.

In operation, with the TTL input at a low voltage level (0.8 v or less), transistor Q1 will be conducting. Node B's voltage level will be equal to the collector emitter voltage (VCE) of transistor Q1, saturated, above the TTL input voltage. At that voltage, M1 will be conducting, pulling the output voltage of the "T" circuit to a high voltage level of VCC minus the voltage drop of the Schottky diode D3. N-channel transistor M2, with its gate connected to the low voltage input will be off and non-conducting. As the TTL input voltage rises, node B will follow the rise and will equal the level of input voltage plus VCE saturated of M1. As the voltage at node B approaches the threshold voltage of M1, transistor Q1 will begin to turn off, reducing through current to the "T" circuit output from VCC. Also, as the TTL input voltage rises, transistor M2 will turn on, sinking transistor M1's current and pulling the "T" circuit output voltage to a low level. As the TTL input voltage continues to rise to a high logic level, it will raise the emitter voltage of transistor Q1 until the voltage differential from Q1's base to emitter is insufficient to keep Q1 on: Q1's base voltage being set by the R1-R2 voltage divider network. With transistor Q1 off, the voltage at node B is no longer fixed at a VCE saturated of transistor Q1 above the TTL input voltage and will be pulled to VCC through resistor R2. With the voltage at node B equal to VCC, the transistor M1 will be completely off and non-conducting. In this state, through current from VCC is completely eliminated. Now, if internal ground voltage fluctuations turn the transistors M2, off and the current sink is removed from the "T" circuit output, there will not be a current source pull up to generate a false output pulse from the "T" circuit.

As the TTL input voltage falls below the voltage set by the resistor divider network R1 and R3, the base-emitter junction of transistor Q1 becomes forward biased, turning Q1 on. The voltage at node B now begins to follow the TTL input voltage at a level equal to VCE of transistor Q1 above it. As node B's voltage level falls, it will turn P-channel transistor M1 on, allowing M1 to conduct current to the output of the "T" circuit. Transistor M2 is turned off as the TTL input voltage level falls, removing the conducting path to ground from the "T" output, thus allowing the "T" output to rise to a high voltage level.

Figure 4:
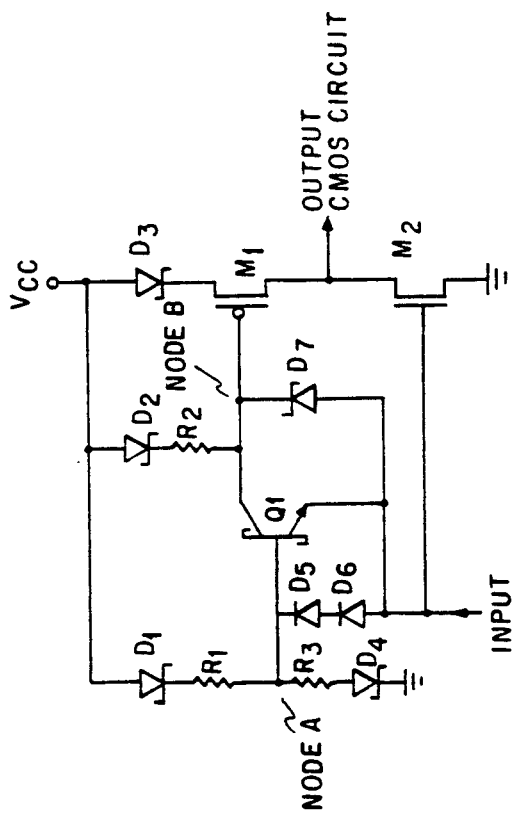
FIG. 4 illustrates a first alternative embodiment of a "T" circuit made according to the teachings of the present invention.

FIG. 4 shows an alternative embodiment of the "T" interface circuit according to the invention. Additional diodes D1, D2, D5, and D6 have been added as shown which allow the circuit to be powered down while the TTL inputs remain connected to active circuitry. Diodes D1 and D2 prevent input current from reaching the VCC nodes of the powered-down "T" circuit.

In this powered-down mode, it is also possible to reverse bias the base-emitter junction of transistor Q1 to a voltage level greater than 3.5 v, which is enough to break it down. Transistor Q1 can be permanently damaged if it is kept in this reverse breakdown voltage condition for an extended period of time Diodes D5 and D6 prevent the base-emitter junction from being reversed biased to a level greater than twice the base emitter voltage VBE. Diode D4 is used to offset the voltage drop of diode D1 in the resistor divider network R1-R2 and allows smaller resistors to be used. Diode D7 is used to help couple the TTL input pulse to node B, thus providing additional switching speed for the "T" circuit.

Figure 5:
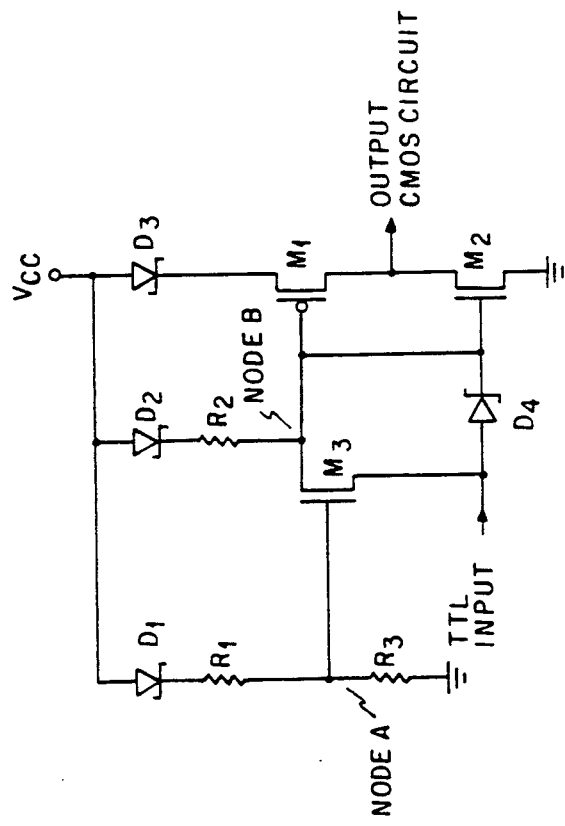
FIG. 5 illustrates a second alternative embodiment of a "T" circuit made according to the teachings of the present invention.

Referring to FIG. 5, yet another embodiment of the "T" circuit according to the invention is shown in which a MOS transistor M3 is substituted for the bipolar transistor Q1 of FIG. 4. In this embodiment, transistor M3's threshold voltage is set by components D1, R1, and R3. Transistors M3's gate voltage will be at a different point than the voltage previously set at the base of the bipolar transistor Q1 because of the different thresholds of the MOS transistor M3 and the bipolar transistor Q1.

Analogous with the embodiment of FIG. 4, as the input voltage rises, node B also rises until the CMOS inverter consisting of M1 and M2 switches. Notice that the gates of M1 and M2 are connected in this embodiment. This arrangement permits the gates of both transistors to pull to VCC through D2 and R2. Thus, a higher voltage is present on both gates than the voltage level present at the TTL input. This higher voltage level assures a good cutoff of M1 and a good turn on of M2, thereby eliminating any through current and reducing glitch susceptibility of the "T" circuit to internal chip ground voltage fluctuations. As with the embodiment of FIG. 4, a speed-up diode D4 AC-couples the TTL input pulse to the gates of M1 and M2, thus providing a capacitive impetus to node B which speeds switching of the "T" circuit.

Figure 6:
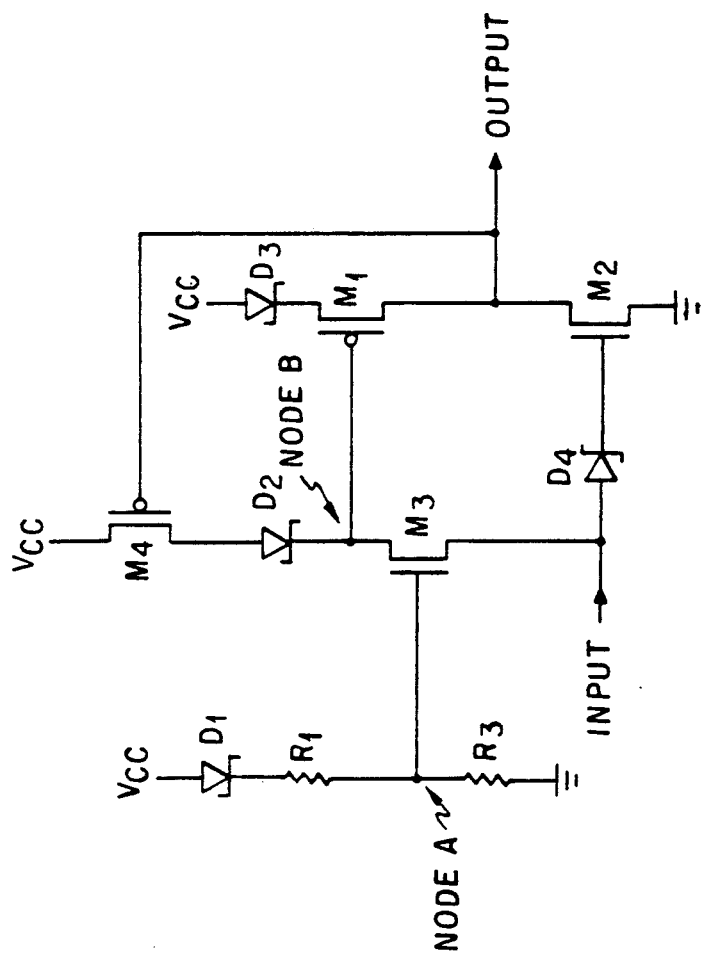
FIG. 6 illustrates a third alternative embodiment of a "T" circuit made according to the teachings of the present invention.

The circuit shown in FIG. 6 represents a third embodiment of a circuit made according to the present invention. This embodiment is the same as that of FIG. 5 except that resistor R2 is replaced with P-channel transistor M4 and diode D2 is connected between M4 and node B. Note that M4 has its gate connected to the output of the "T" circuit. In this embodiment, when the TTL input is high and the separating transistor M3 is off, node B is pulled to VCC by transistor M4 through diode D2 similar to the embodiment in FIG. 5. When the TTL input voltage signal is low however, the output voltage signal of the circuit will be high thereby turning transistor M4 off. Thus, the small DC input current that may be present in the FIG. 5 embodiment for a TTL low input voltage signal is completely eliminated for a high or low TTL input voltage signal in the FIG. 6 embodiment. By selecting transistor M4 to be small, and thus resistive, the transient current needed to switch the TTL input from high to low is also kept small. Diode D2 prevents current flow to supply voltage VCC in the event that the current is powered down while the circuit input remains coupled to active circuitry.

The present invention is described with reference to the various embodiments by way of example only and the description is not to be construed as limiting. Alternative embodiments may be constructed from the above teachings by those skilled in the art and such embodiments are contemplated as within the scope of the appended claims.

What is claimed is:

1. A TTL compatible BiCMOS input buffer circuit comprising:
    (a) a TTL input for providing TTL input voltage signals;
    (b) a source of relatively high voltage and a source of relatively low voltage;
    (c) an input inverter coupled between said source of relatively high voltage and said source of relatively low voltage, said inverter having a first semiconductor device having a first gate and a second semiconductor device having a second gate coupled to said TTL input for receiving said TTL input voltage signals from said TTL input and a terminal for transmitting an output signal operable as an input to a CMOS circuit; and
    (c) separating circuitry connected between said first and second gates and responsive to a said TTL input voltage signals for controlling said first gate and electrically isolating said first gate from said TTL input to turn on only one of said first and second semiconductor devices.

2. The input circuit of claim 1, further including a constant ratio voltage divider network, wherein said separating circuitry further includes a transistor having a collector coupled to said first gate and said high voltage source, an emitter coupled to said second gate and a base coupled to said voltage divider network.

3. The input circuit of claim 2 further including a first resistor connected between said collector and said high voltage source.

4. A circuit for receiving a TTL input signal and outputting a signal operable an as input to a CMOS circuit comprising:
  (a) a TTL input for providing TTL input voltage signals;
  (b) a source of relatively high voltage and a source of relatively low voltage;
  (c) an input inverter coupled between said source of relatively high voltage and said source of relatively low voltage, said inverter having a first semiconductor device having a first gate and a second semiconductor device having a second gate coupled to said TTL input for receiving said TTL input voltage signals from said TTL input;
  (c) a first load device connected between said inverter and said source of relatively high voltage; and
  (d) separating circuitry connected between said first gate and said TTL input and responsive to a said TTL input voltage signals for controlling said first gate and electrically isolating said first gate from said TTL input to turn on only one of said first and said second semiconductor devices.

5. The circuit of claim 4, further including a constant ratio voltage divider network, wherein said separating circuitry further includes a transistor having a collector coupled to said first gate and said high voltage source, a base coupled to said voltage divider network and an emitter coupled to said second gate.

6. The circuit of claim 5 further including a second load device coupled between said emitter and said first gate.

7. The circuit of claim 5 further including a third load device coupled between said emitter and said base of said transistor.

8. An interface circuit receiving TTL voltage signals as an input and transmitting CMOS voltage signals as an output comprising:
  (a) a TTL input for providing TTL input voltage signals;
  (b) a source of relatively high voltage and a source of relatively low voltage;
  (c) an MOS inverter circuit coupled between said source relatively of high voltage and said source of relatively low voltage, said inverter circuit having a first semiconductor device having a first gate and a second semiconductor device having a second gate coupled to said TTL input for receiving TTL input voltage signals from said TTL input and an output mode for transmitting CMOS voltage signals;
  (d) a first load device coupled between said MOS inverter circuit and said source of high voltage; and
  (e) separating circuitry coupled between said first and second gates and responsive to said TTL input voltage signals for controlling said first gate and electrically isolating said first gate from said TTL input to turn on only one of said first and second semiconductor devices.

9. The interface circuit of claim 8, further including a voltage divider, wherein said separating circuitry includes a first MOS transistor having a first source coupled to said first gate, a first drain coupled to said second gate and a first input gate coupled to said voltage divider network.

10. The interface circuit of claim 8 further including a second load device coupled between said first gate and said source of high voltage.

11. The interface circuit of claim 8 further including a third load device coupled between said drain of said MOS transistor and said second gate.

12. The interface circuit of claim 8 wherein said first and second gates are connected.

13. An interface circuit receiving input TTL voltage signals from an input voltage signal source and transmitting output CMOS voltage signals, comprising:
  (a) a TTL input for provide TTL input voltage signals;
  (b) a source of relatively high voltage and a source of relatively low voltage;
  (c) an MOS inverter circuit coupled between said source of relatively high voltage and said source of relatively low voltage, said inverter circuit having a first semiconductor device having a first gate and a second semiconductor device having a second gate coupled to said TTL input for receiving TTL input voltage signals and an output node for transmitting output CMOS voltage signals;
  (d) a first load device coupled between said MOS inverter circuit and said source of relatively high voltage; and
  (e) separating circuitry coupled between said first gate and said second gate and said TTL input for controlling said first gate and electrically isolating said first gate from said TTL input; and
  (f) a voltage divider;
  said separating circuitry further comprising:
  (g) a first MOS transistor having a first source coupled to said first gate, a first drain coupled to said second gate and a first input gate coupled to said voltage divider network; and
  (h) a second MOS transistor having a second source coupled to said source of relatively high voltage, a second drain coupled to said first gate and a second input gate coupled to said output node of said interface circuit.

14. The interface circuit of claim 13 wherein said separating circuitry further includes a second load device coupled between said first gate and said source of high voltage.

15. The interface circuit of claim 13 wherein said separating circuitry further includes a third load device coupled between said second gate and said input voltage signal source.

* * * * *